United States Patent [19]

Cernea

[11] Patent Number: 5,436,587
[45] Date of Patent: Jul. 25, 1995

[54] CHARGE PUMP CIRCUIT WITH EXPONETRAL MULTIPLICATION

[75] Inventor: Raul-Adrian Cernea, Cupertino, Calif.

[73] Assignee: SunDisk Corporation, Santa Clara, Calif.

[21] Appl. No.: 157,573

[22] Filed: Nov. 24, 1993

[51] Int. Cl.⁶ .............................................. H02M 3/18
[52] U.S. Cl. ................................. 327/536; 327/390; 327/346; 307/110; 363/60
[58] Field of Search .................. 307/110, 296.2, 264, 307/529, 492, 110; 363/60, 59; 328/168, 144; 327/537, 536, 534, 390, 346, 284

[56] References Cited

U.S. PATENT DOCUMENTS

| | | | |
|---|---|---|---|
| 4,000,412 | 12/1976 | Rosenthal et al. | 307/208 |
| 4,053,821 | 10/1977 | Hose, Jr. et al. | 363/60 |
| 4,149,232 | 4/1979 | Eaton, Jr. | 363/60 |
| 4,271,461 | 6/1981 | Hoffmann et al. | 363/60 |
| 4,511,811 | 4/1985 | Gupta | 307/463 |
| 4,638,464 | 1/1987 | Cranford, Jr. et al. | 365/226 |
| 4,673,829 | 6/1987 | Gupta | 307/296 A |
| 4,769,753 | 9/1988 | Knudson et al. | 363/60 |

OTHER PUBLICATIONS

Dickson, J. F., "On-Chip High-Voltage Generation in MNOS Integrated Circuits Using an Improved Voltage Multiplier Technique," *IEEE Journal of Solid-State Circuits*, vol. SC-11, No. 3, pp. 374–378 (1976).

*Primary Examiner*—Timothy P. Callahan
*Assistant Examiner*—Terry L. Englund
*Attorney, Agent, or Firm*—Majestic, Parsons, Siebert & Hsue

[57] ABSTRACT

A charge pump circuit comprises a plurality of voltage doubler circuits connected together such that a first voltage output generated by a first portion of a kth one of the voltage doubler circuits is substantially equal to $Vdd*2^k$ and $Vdd*2^{k-1}$ on odd and even phases, respectively, of a first clock signal, and a second voltage output generated by a second portion of the kth one of the voltage doubler circuits is substantially equal to $Vdd*2^{k-1}$ and $Vdd*2^k$ on the odd and even phases, respectively, of the first clock signal. Each of the voltage doubler circuits is constructed such that when its first portion is providing a voltage of $Vdd*2^k$ and a current to a next stage, its second portion is recharging a capacitor in that portion to $Vdd*2^{k-1}$, and when its second portion is providing a voltage of $Vdd*2^2$ and a current to the next stage, its first portion is recharging a capacitor in that portion to $Vdd*2^{k-1}$. An output circuit is connected to a last one of the voltage doubler circuits to provide other circuitry with a substantially constant output voltage Vpp and output current Ipp, by providing such voltage and current from a first voltage output of the last voltage doubler circuit on odd phases of the first clock signal, and from a second voltage output of the last voltage doubler circuit on even phases of the first clock signal.

15 Claims, 8 Drawing Sheets

CHARGE PUMP CIRCUIT WITH EXPONETRAL MULTIPLICATION

BACKGROUND OF THE INVENTION

This invention relates in general to voltage generation circuits and in particular, to a charge pump circuit for receiving a voltage, generating an output voltage greater than the received voltage, and providing the generated output voltage, in addition to an output current, to other circuitry in a system.

Charge pump circuits are used in various applications such as, for example, in an electrically programmable and erasable, read-only-memory ("EEPROM"). In an EEPROM, high voltages are required to program and erase the memory cells, while a lower, logic level voltage is only required to read their programmed states. To eliminate a high voltage input to the EEPROM, an on-chip, charge pump circuit can be included that generates the required high programing and erasing voltages from the lower, logic level voltage.

FIG. 1 illustrates one prior art version of a charge pump circuit, wherein an output voltage generated from such a circuit can be shown to be:

$$\text{Vout} = [Vdd + n(Vclk - VT)] - VT \quad (1)$$

where "VT" is the voltage drop across each diode transistor; "Vdd" is an input voltage typically supplied from an external power supply; "n" is the number of diode-capacitor stages; and "Vclk" is the voltage amplitude of the clock signals, CLK and CLKB, which is typically the same as Vdd.

Although simple to implement, the charge pump circuit of FIG. 1 is deficient in at least three respects. First, each stage of the circuit contributes a diode voltage drop VT, so that for n stages the cumulative voltage drop acting to reduce the output voltage adds up to n*VT. Second, the circuit only supplies output current during one phase of the clock since the capacitors are recharged during the other phase. Third, the isolation diode at the output of the circuit reduces the output voltage by still another diode voltage drop VT.

FIG. 2 illustrates another prior art version of a charge pump circuit. Although this version avoids the cumulative voltage drop, n,VT, experienced by the charge pump circuit of FIG. 1, it is still deficient in at least two respects. First, like the charge pump circuit of FIG. 1, it only supplies output current during one phase of the clock. Second, an isolation diode at the output of the circuit reduces the output voltage by a voltage drop VT. The output voltage generated from this circuit can be shown to be:

$$\text{Vout} = [Vdd + n(Vdd)] - VT \quad (2)$$

U.S. Pat. No. 4,888,738, incorporated herein by reference, and co-invented by the inventor of the present invention, discloses another prior art version of a charge pump circuit which supplies current on both halves of a clock signal and eliminates the diode voltage drop VT in a first stage of the charge pump circuit, but does not disclose how to eliminate voltage drops VT contributed by subsequent stages of a charge pump circuit, nor how to eliminate a final voltage drop due to an isolation diode at the output of a charge pump circuit.

OBJECTS AND SUMMARY OF THE INVENTION

Accordingly, one object of the present invention is a charge pump circuit having an output voltage: which does not experience a diode voltage drop contribution from each stage of the circuit.

Another object is a charge pump circuit having an output voltage which does not experience a diode voltage drop contribution from an isolation diode at the output of the circuit.

Another object of the present invention is a charge pump circuit having an output current which is supplied by the circuit on both phases of a clock signal driving the circuit.

Still another object of the present invention is a charge pump circuit which minimizes the silicon area required for its implementation in an integrated circuit, that minimizes any parasitic losses associated with its implementation in the integrated circuit, and maximizes its performance with respect to the integrated circuit.

These and additional objects are accomplished by the various aspects of the present invention, wherein briefly stated, one aspect of the invention is a charge pump circuit comprising a plurality of voltage doubler stages (e.g., n stages). Since each stage (e.g., a kth stage) of the charge pump circuit provides to a next stage (.e.g., a k+1 stage), a voltage output which is double a voltage output from a preceding stage (e.g., a k−1 stage), an output voltage Vout for the charge pump circuit can be shown to be:

$$\text{Vout} = Vdd*2^n \quad (3)$$

Since the output voltage Vout of the charge pump circuit of the present invention increases exponentially as the number of stages increases, whereas the output voltages of prior art circuits only increase linearly as the number of their stages increase (ref. eqs. 1 and 2), it can be shown that the charge pump circuit of the present invention generally requires fewer stages than that of prior art circuits to generate a same output voltage level. As a result, the charge pump circuit of the present invention requires less circuitry to implement it and accordingly, takes up less silicon area to fabricate it on an integrated circuit. Further, because of its reduced circuit requirements, parasitic losses arising from its implementation in silicon is also less than those of prior art charge pump circuits.

In its preferred embodiment, each stage of the charge pump circuit of the present invention comprises a mirrored pair of voltage doubler circuits, wherein during a first phase of a clock signal, a first of the mirrored pair provides a doubled voltage and a current to a next stage while a second of the mirrored pair is recharging, and during a second phase of the clock signal, the second of the mirrored pair provides a doubled voltage and a current to the next stage while the first of the mirrored pair is recharging. As a result of such flip-flop action, the charge pump circuit of the present invention provides an output current, as well as an output voltage, on both phases of the clock signal.

Also, in its preferred embodiment, each stage of the charge pump circuit of the present invention includes "dynamic diodes" created by cross-coupling the gates of two diode transistors, one in each of the voltage doubler circuits of the mirrored pair for that stage, which connect corresponding output voltages of a previous stage to corresponding charge capacitors, one in each of the voltage doubler circuits of the mirrored pair for that stage. As a result of creating such "dynamic diodes" in each stage, the charge pump circuit of the present invention avoids a diode voltage drop contribution from each stage to the output voltage Vpp (also referred to herein as Vout) of the charge pump circuit of the present invention.

Also, in its preferred embodiment, an output stage of the charge pump circuit of the present invention includes "dynamic diodes" created by cross-coupling the gates of corresponding isolation diode transistors, one in each of two isolation circuits forming a mirrored pair in the output stage, which respectively provide the output voltage Vpp, on alternating phases of the first clock signal, from corresponding first and second voltage outputs of a last voltage doubler stage of the charge pump circuit. As a result of creating such "dynamic diodes" in an output stage of the charge pump circuit of the present invention, the charge pump circuit avoids a diode voltage drop resulting from an isolation diode at the output of the charge pump circuit of the present invention.

Also, in its preferred embodiment, the output stage of the charge pump circuit of the present invention also generates first and second high voltage clock signals, Hclk and $\overline{\text{Hclk}}$, respectively, from first and second nth voltage outputs, Vn1 and Vn2, respectively, of the last (nth) voltage doubler stage, and provides the thus generated first and second high voltage clock signals, Hclk and $\overline{\text{Hclk}}$, to each of the plurality of voltage doubler stages, except the 1st voltage doubler stage, in order to control the recharging of the charge capacitors through the "dynamic diodes" in each of the plurality of voltage doubler stages.

In another aspect of the present invention, a method of generating a high voltage Vpp from a lower voltage Vdd comprises the steps of: (a) connecting, in response to a first phase of a high voltage clock signal, a first end of a capacitor in at least one stage of a charge pump circuit to a voltage output of a previous stage of the charge pump circuit, and connecting, in response to a second phase of the high voltage clock signal, the first end of the capacitor in the at least one stage to a ground reference voltage, so that a second end of the capacitor in the at least one stage provides a voltage output for that at least one stage which is equal to twice the voltage output of the previous stage during the first phase of the high voltage clock signal, and is equal to the voltage output of the previous stage during the second phase of the high voltage clock signal; and (b) generating the high voltage clock signal from a voltage output of a last stage of the charge pump circuit, and providing the generated high voltage clock signal to the at least one stage of the charge pump circuit.

Additional objects, features and advantages of the various aspects of the present invention will become apparent from the following description of its preferred embodiments, which description should be taken in conjunction with the accompanying drawings.

DETAILED DESCRIPTION OF THE PREFERRED EMBODIMENT

Figure 1:
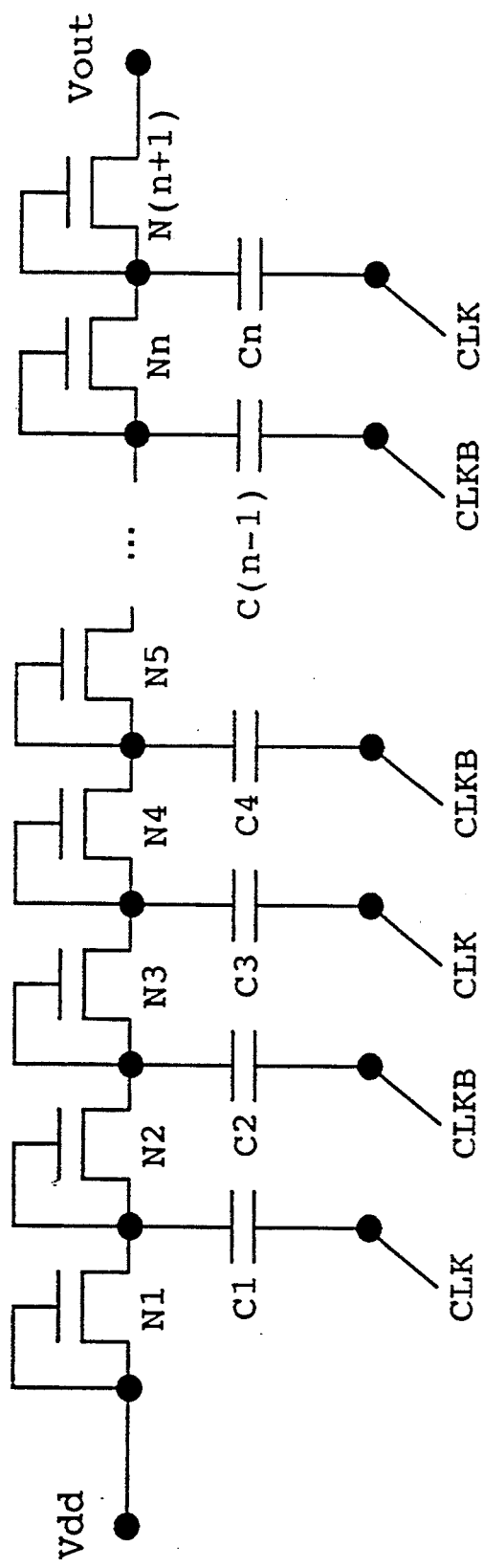
FIG. 1 illustrates, as an example, a first prior art charge pump circuit.
Figure 2:
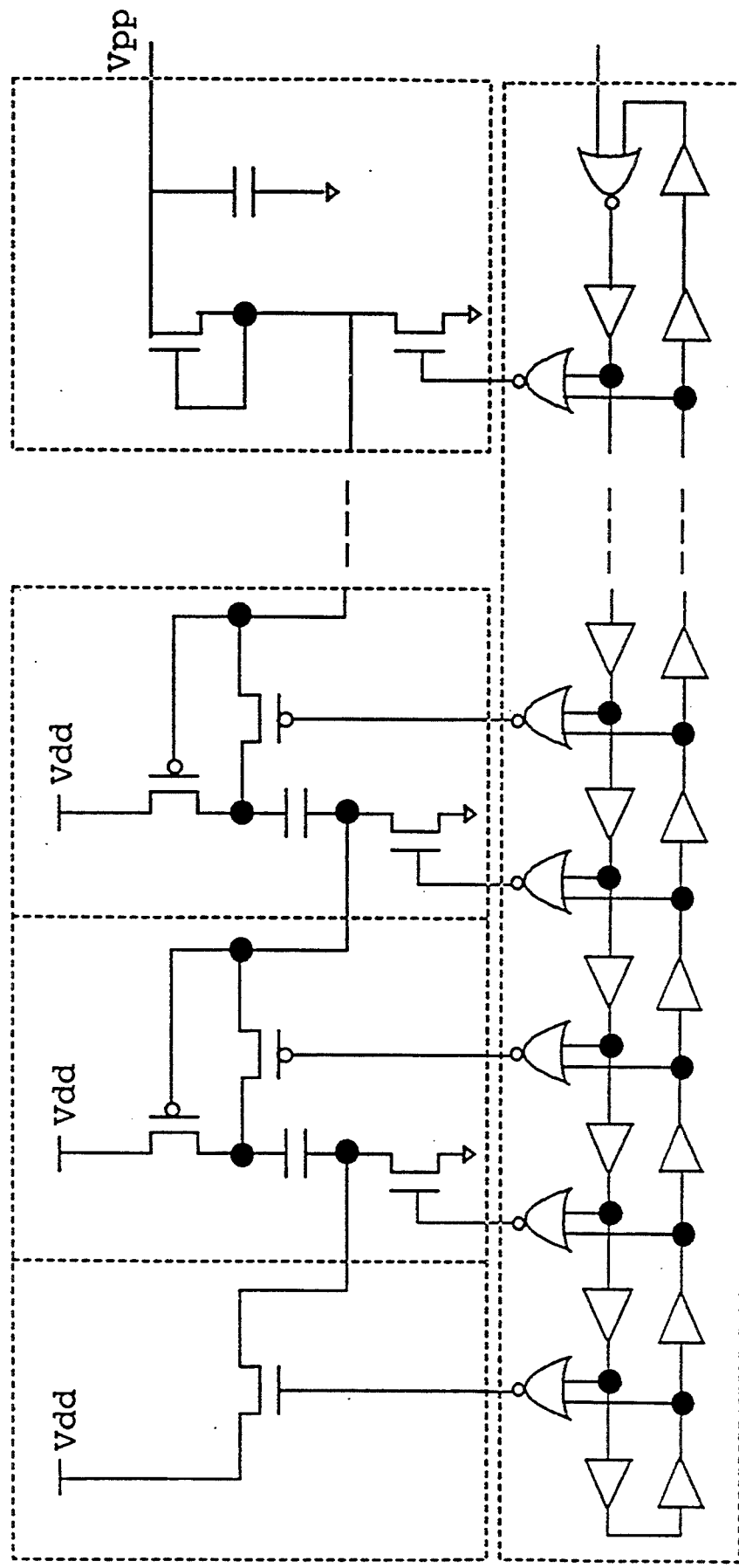
FIG. 2 illustrates, as an example, a second prior art charge pump circuit.
Figure 3:
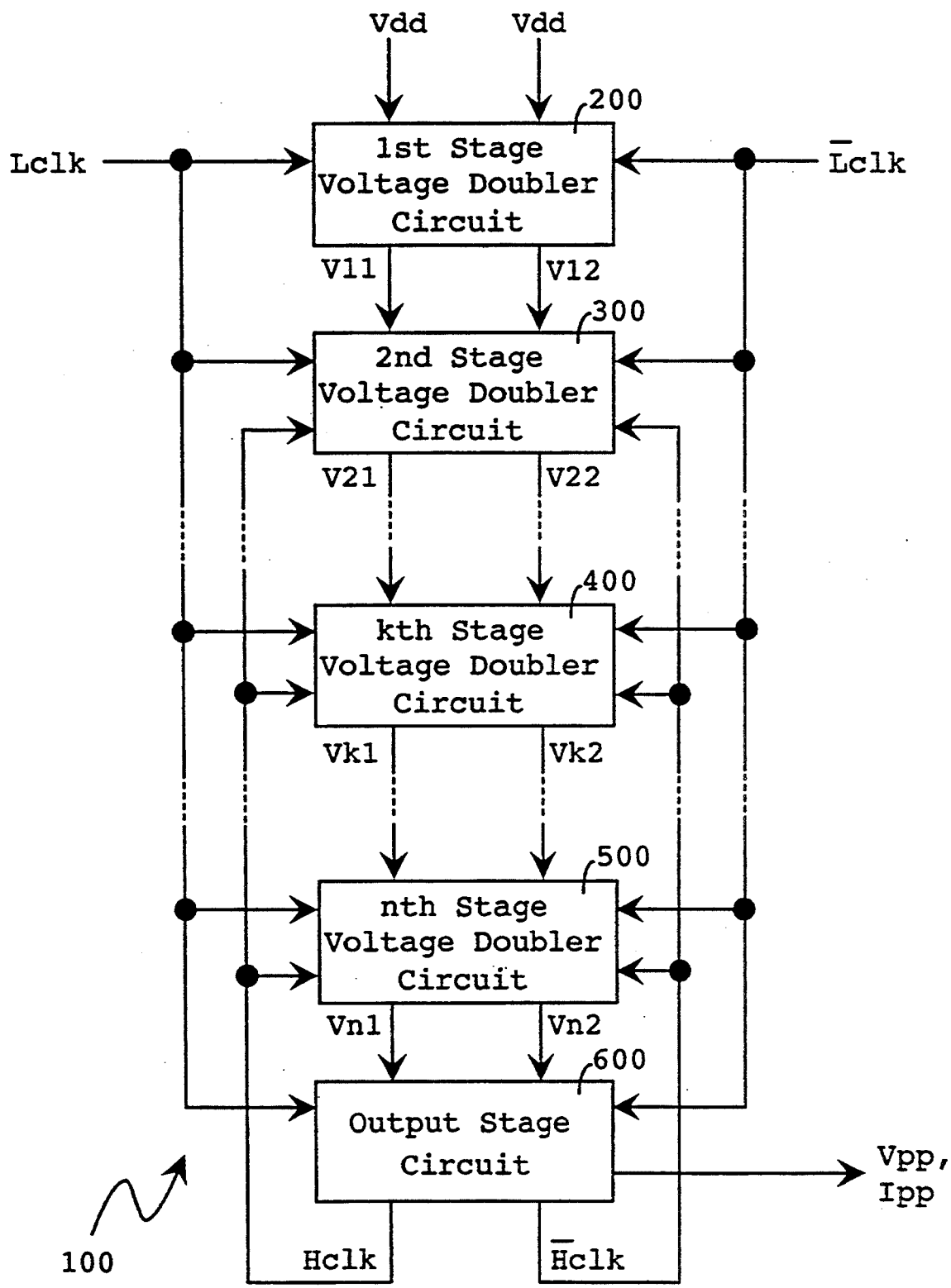
FIG. 3 illustrates, as an example, a block diagram of a charge pump circuit utilizing aspects of the present invention.

FIG. 3 illustrates, as an example, a block diagram of a charge pump circuit 100, utilizing aspects of the present invention. The charge pump circuit 100 comprises a plurality (e.g., n) of voltage doubler circuits (e.g., 200-500). A 1st stage voltage doubler circuit 200 receives a voltage Vdd from a voltage source (not shown), and generates first and second voltage outputs, V11 and V12, respectively, in response to first and second clock signals, Lclk and $\overline{\text{Lclk}}$, respectively.

The first voltage output V11 is substantially equal to Vdd*2 and Vdd on first and second phases, respectively, of the first clock signal Lclk, and the second voltage output V12 is substantially equal to Vdd and Vdd*2 on first and second phases, respectively, of the second clock signal $\overline{\text{Lclk}}$. The second clock signal $\overline{\text{Lclk}}$, is generally an inverted version of the first clock signal, Lclk, so that when the first phase of the first clock signal Lclk is LOW, the first phase of the second clock signal $\overline{\text{Lclk}}$ is HIGH, and vice versa.

In the preferred embodiment of the invention, when the first phase of the first clock signal Lclk is LOW, the first voltage output V11 is substantially equal to Vdd*2, and when the second phase of the first clock signal Lclk is HIGH, the first voltage output V11 is substantially equal to Vdd. Since the first phase of the second clock signal $\overline{\text{Lclk}}$ is HIGH when the first phase of the first clock signal Lclk is LOW, the second voltage output V12 is equal to Vdd during this time, and since the second phase of the second clock signal $\overline{\text{Lclk}}$ is LOW when the second phase of the first clock signal is HIGH, the second voltage output V12 is substantially equal to Vdd*2 during this time.

A 2nd stage voltage doubler circuit 300 receives the first and second voltage outputs, V11 and V12, respectively, from the 1st stage voltage doubler circuit 200, first and second high voltage clock signals, Hclk and $\overline{\text{Hclk}}$, respectively, from an output stage circuit 600, and the first and second clock signals, Lclk and $\overline{\text{Lclk}}$, respectively, and generates first and second 2nd voltage outputs, V21 and V22, respectively, in response thereof.

The first 2nd voltage output V21 is substantially equal to Vdd*4 and Vdd*2 on first and second phases, respectively, of the first clock signal Lclk, and the second 2nd voltage output 422 is substantially equal to Vdd*2 and Vdd*4 on first and second phases, respectively, of the second clock signal $\overline{\text{Lclk}}$. The first and second high voltage clock signals, Hclk and $\overline{\text{Hclk}}$, respectively, are synchronized with the first and second clock signals, Lclk and $\overline{\text{Hclk}}$, respectively, so that when the first and second phases of the first clock signal Lclk are LOW and HIGH, respectively, first and second phases of the first high voltage clock signal Hclk are also LOW and HIGH, respectively, and when the first and second phases of the second clock signal $\overline{\text{Lclk}}$ are HIGH and LOW, respectively, a first and second phase of the second high voltage clock signal $\overline{\text{Hclk}}$ are also HIGH and LOW, respectively.

In particular, in the preferred embodiment of the invention, when the first phase of the first clock signal Lclk is LOW, the first 2nd voltage output V21 is substantially equal to Vdd*4, and when the second phase of the first clock signal Lclk is HIGH, the first 2nd voltage output V21 is substantially equal to Vdd*2. Also, when the first phase of the second clock signal Lclk is HIGH, the second 2nd voltage output V22 is substantially equal to Vdd*2, and when the second phase of the second clock signal $\overline{\text{Lclk}}$ is LOW, the second 2nd voltage output V22 is substantially equal to Vdd*4.

A kth stage voltage doubler circuit 400 receives first and second voltage outputs, V(k−1)1 and V(k−1)2, respectively, from a (k−1)th stage voltage doubler circuit (not shown, but implied by dotted lines between the 2nd and kth stage voltage doubler circuits, 300 and 400, respectively), the first and second clock signals, Lclk and $\overline{\text{Lclk}}$, respectively, and the first and second high voltage clock signals, Hclk and $\overline{\text{Hclk}}$, respectively, and generates first and second kth voltage outputs, Vk1 and Vk2, respectively, in response thereof.

The first kth voltage output Vk1 is substantially equal to $Vdd*2^k$ and $Vdd*2^{k-1}$ on first and second phases, respectively, of the first clock signal Lclk, and the second kth voltage output Vk2 is substantially equal to $Vdd*2^{k-1}$ and $Vdd*2^k$ on first and second phases, respectively, of the second clock signal $\overline{\text{Lclk}}$. In particular, in the preferred embodiment of the invention, when the first phase of the first clock signal Lclk is LOW, the first kth voltage output Vk1 is substantially equal to $Vdd*2^k$, and when the second phase of the first clock signal Lclk is HIGH, the first kth voltage output Vk1 is substantially equal to $Vdd*2^{k-1}$. Also, when the first phase of the second clock signal $\overline{\text{Lclk}}$ is HIGH, the second kth voltage output Vk2 is substantially equal to $Vdd*2^{(k-1)}$, and when the second phase of the second clock signal $\overline{\text{Lclk}}$ is LOW, the second kth voltage output Vk2 is substantially equal to $Vdd*2^k$.

A last (e.g., nth) stage voltage doubler circuit 500 operates like the kth stage voltage doubler circuit 400, in that it receives first and second voltage outputs, V(n−1)1 and V(n−1)2, respectively, from a (n−1)th stage voltage doubler circuit (not shown, but implied by dotted lines between the kth and nth stage voltage doubler circuits, 400 and 500, respectively), and generates first and second nth voltage outputs, Vn1 and Vn2 respectively, in response to the first and second clock signals, Lclk and $\overline{\text{Lclk}}$, respectively, and the first and second high voltage clock signals, Hclk and $\overline{\text{Hclk}}$, respectively.

The first nth voltage output Vn1 is substantially equal to $Vdd*2^n$ and $Vdd*2^{n-1}$ on first and second phases, respectively, of the first clock signal Lclk, and the second nth voltage output Vn2 is substantially equal to $Vdd*2^{n-1}$ and $Vdd*2^n$ on first and second phases, respectively, of the second clock signal $\overline{\text{Lclk}}$. In particular, in the preferred embodiment of the invention, when the first phase of the first clock signal Lclk is LOW, the first nth voltage output Vn1 is substantially equal to $Vdd*2^n$, and when the second phase of the first clock signal Lclk is HIGH, the first nth voltage output Vn1 is substantially equal to $Vdd*2^{(n-1)}$. Also, when the first phase of the second clock signal $\overline{\text{Lclk}}$ is HIGH, the second nth voltage output Vn2 is substantially equal to $Vdd*2^{(n-1)}$, and when the second phase of the second clock signal $\overline{\text{Lclk}}$ is LOW, the second nth voltage output Vn2 is substantially equal to $Vdd*2^n$.

An output stage circuit 600 receives the first and second nth voltage outputs, Vn1 and Vn2, respectively, from the nth (e.g., last) stage voltage doubler circuit 500, and generates a voltage output Vpp in response to the first and second clock signals, Lclk and $\overline{\text{Lclk}}$, respectively. During the first phases of the first and second clock signals, Lclk and $\overline{\text{Lclk}}$, respectively, the output stage circuit 600 generates Vpp from the first nth voltage output Vn1, which is substantially equal to $Vdd*2^2$ at that time, and during the second phases of the first and second clock signals, Lclk and $\overline{\text{Lclk}}$, respectively, the output stage circuit 600 generates Vpp from the second nth voltage output Vn2, which is substantially equal to $Vdd*2^n$ at that time. As a result, the output stage circuit 600 provides a relatively constant voltage output Vpp substantially equal to $Vdd*2^n$ to other circuitry (not shown) during the first and second phases of the first and second clock signals, Lclk and $\overline{\text{Lclk}}$, respectively.

In addition, the output stage circuit 600 also generates first and second high voltage clock signals, Hclk and $\overline{\text{Hclk}}$, respectively, in response to the first and second clock signals, Lclk and $\overline{\text{Lclk}}$, respectively, and provides the generated first and second high voltage clock signals, Hclk and $\overline{\text{Hclk}}$, respectively, to the 2nd through nth stage voltage doubler circuits 300–500. In the preferred embodiment of the present invention, when the first and second phases of the first clock signal Lclk are LOW and HIGH, respectively, the first and second phases of the first high voltage clock signal Hclk are 0 volts and Vpp, respectively, and when the first and second phases of the second clock signal $\overline{\text{Lclk}}$ are HIGH and LOW, respectively, the first and second phases of the second high voltage clock signal $\overline{\text{Hclk}}$ are Vpp and 0 volts, respectively.

The output stage circuit 600 also provides output current Ipp to the other circuitry (not shown) while providing the output voltage Vpp. Similar to the generation of the output voltage Vpp, during the first phases of the first and second clock signals, Lclk and $\overline{\text{Lclk}}$, respectively, the output stage circuit 600 provides output current Ipp from the first nth voltage output Vn1 leg of the nth stage voltage doubler circuit 500, and during the second phases of the first and second clock signals, Lclk and $\overline{\text{Lclk}}$, respectively, the output stage circuit 600 provides output current Ipp from the second nth voltage output Vn2 leg of the nth stage voltage doubler circuit 500. As a result, the output stage circuit 600 provides a relatively constant output current Ipp to the other circuitry (not shown).

Figure 4:
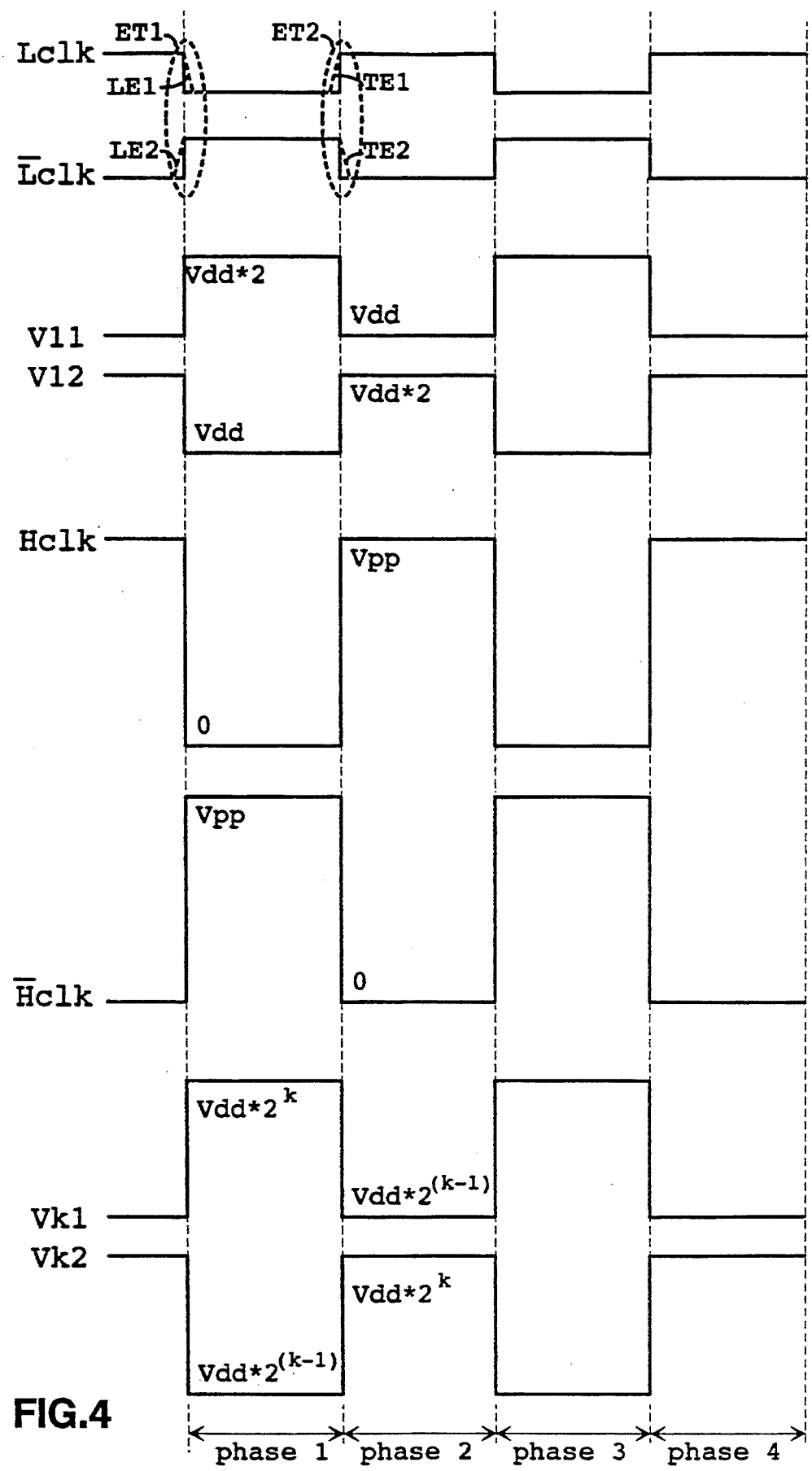
FIG. 4 illustrates, as examples, timing diagrams for four phases of the first and second clock signals, Lclk and $\overline{\text{Lclk}}$, first and second 1st voltage outputs, V11 and V12, first and second high voltage clock signals, Hclk and $\overline{\text{Hclk}}$, and first and second kth voltage outputs, Vk1 and Vk2, respectively.

FIG. 4 illustrates, as examples, timing diagrams for four phases of the first and second clock signals, Lclk and $\overline{\text{Lclk}}$, first and second 1st voltage outputs, V11 and V12, first and second high voltage clock signals, Hclk and $\overline{\text{Hclk}}$, and first and second kth voltage outputs, Vk1 and Vk2. As previously described, when the first clock signal Lclk is LOW (e.g., odd phases 1 and 3), the second clock signal $\overline{\text{Lclk}}$ is HIGH, the second high voltage clock signal $\overline{\text{Hclk}}$ is HIGH, each of the first voltage outputs (e.g., V11, Vk1 ... Vn1) of each of the plurality of voltage doubler circuits (e.g., 200–500) is HIGH, the first high voltage clock signal Hclk is LOW, and each of the second voltage outputs (e.g., V12, Vk2 ... Vn2) of each of the plurality of voltage doubler circuits (e.g., 200–500) is LOW. Conversely, when the first clock signal Lclk is HIGH (e.g., even phases 2 and 4), the second clock signal $\overline{\text{Lclk}}$ is LOW, the second high voltage clock signal $\overline{\text{Hclk}}$ is LOW, each of the first voltage outputs (e.g., V11, Vk1 ... Vn1) of each of the plurality of voltage doubler circuits (e.g., 200–500) is LOW, the first high voltage clock signal Hclk is HIGH, and each of the second voltage outputs (e.g., V12, Vk2 ... Vn2) of each of the plurality of voltage doubler circuits (e.g., 200–500) is HIGH.

As can be seen in the timing diagrams illustrated in FIG. 4, in the preferred embodiment of the invention, each of the voltage outputs (e.g., V11 V12, Vk1, Vk2) of each of the plurality of voltage doubler circuits swings between $Vdd*2^k$ and $Vdd*2^{(k-1)}$, where k is the stage of the voltage doubler circuit, and each of the high voltage clock signals, Hclk and $\overline{\text{Hclk}}$, swing between 0 and Vpp. Also, in the preferred embodiment of the invention, at each edge transition (e.g., ET1 and ET2) of the first and second clock signals,. Lclk and $\overline{\text{Lclk}}$, the leading (e.g., LE1 and LE2, respectively) and trailing edges (e.g., TE1 and TE2, respectively) of the first and second clock signals, Lclk and $\overline{\text{Lclk}}$, are generated in such a manner that both the first and second clock signals, Lclk and $\overline{\text{Lclk}}$, can never be LOW at the same time. Consequently, although in general the first and second clock signals, Lclk and $\overline{\text{Lclk}}$, are generally inverted versions of one another, during their edge transitions (e.g., ET1 and ET2) they are allowed to temporarily be both HIGH at the same time to ensure that they can never be both LOW at the same time.

Figure 5:
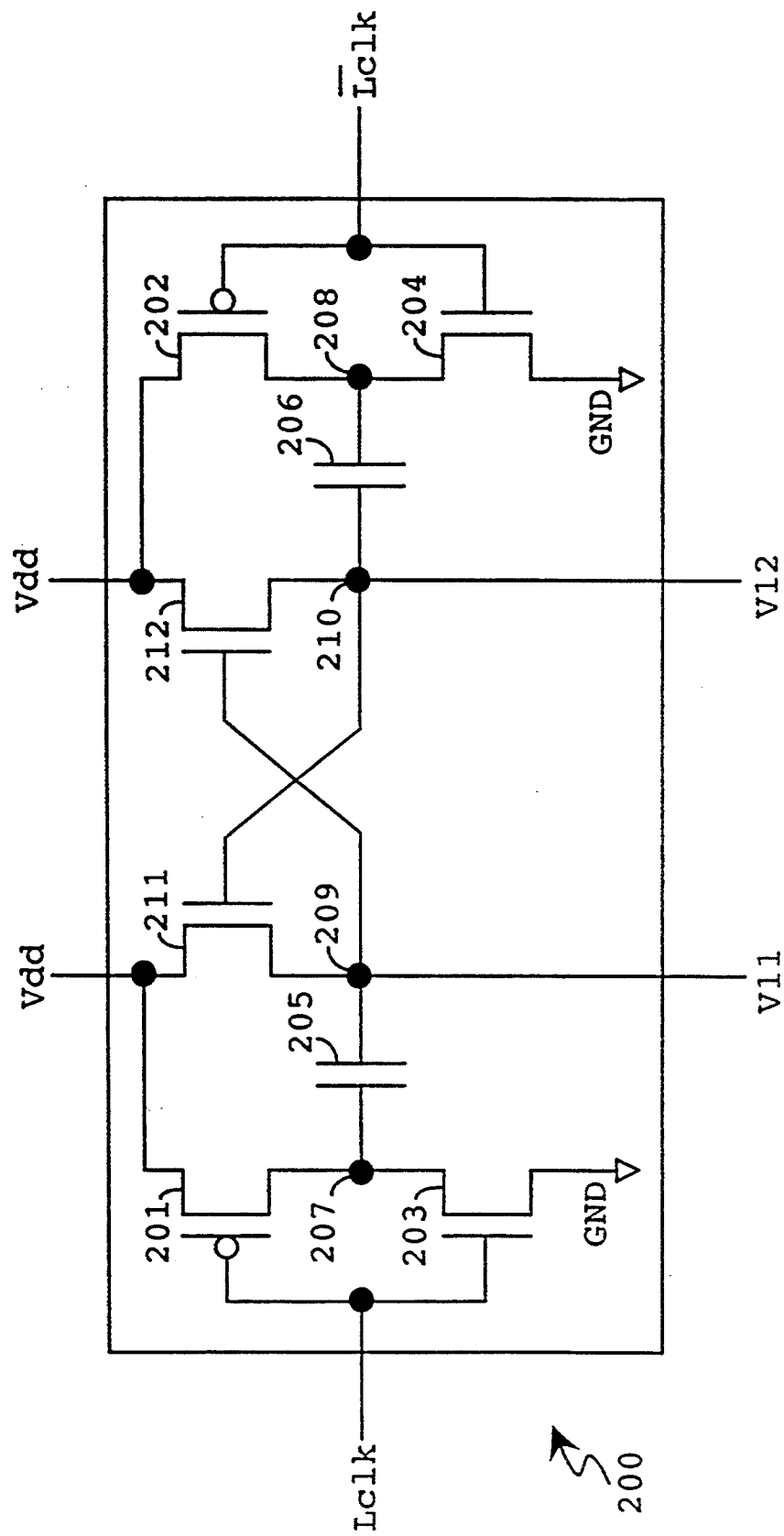
FIG. 5 illustrates, as an example, a circuit diagram of the 1st Stage Voltage Doubler Circuit block of FIG. 3, utilizing aspects of the present invention.

FIG. 5 illustrates, as an example, a circuit diagram of the 1st Stage Voltage Doubler Circuit block of FIG. 3, utilizing aspects of the present invention. During a first phase, the first clock signal Lclk is LOW and consequently, p-mos FET 201 turns ON, n-mos FET 203 turns OFF, and node 207 rises to Vdd. Assuming that capacitor 205 has been charged to Vdd on a previous clock cycle, the first voltage output V11 at node 209 thereupon rises to Vdd*2.

During a second phase, the first clock signal Lclk is HIGH and consequently, p-mos FET 201 turns OFF, n-mos FET 203 turns ON, and node 207 is pulled towards ground. Although capacitor 205 had been charged to Vdd during a previous cycle, capacitor 205 has lost some voltage $\Delta V$ due to charge sharing, capacitive coupling, and/or leakage while providing the first voltage output V11 to the 2nd stage voltage doubler circuit during the first phase of the first clock cycle. Consequently, the first voltage output V11 at node 209 drops back from $Vdd*2-\Delta V$, instead of $Vdd*2$, to $Vdd-\Delta V$, instead of Vdd, during the second phase. At the same time, the second clock signal $\overline{\text{Lclk}}$ is LOW and consequently, p-mos FET 202 turns ON, n-mos FET 204 turns OFF, and node 208 is pulled up to Vdd. Assuming that capacitor 206 has also been charged to Vdd during a previous cycle, the second voltage output V12 at node 210 rises to Vdd*2. Since the first voltage output V11 at node 209 is connected to a gate of n-mos FET 212 and almost simultaneously drops to $Vdd-\Delta V$, n-mos FET 212 is turned OFF, and the second voltage output V12 does not discharge back through the n-mos FET 212 and is therefore, available as an input and provides current to the 2nd stage voltage doubler circuit 300. Also, since the second voltage output V12 at node 210 is connected to a gate of n-mos FET 211 and is sufficiently greater than the voltage at node 209 connected to the source of the n-mos FET 211, the n-mos FET 211 turns ON, thus pulling node 209 up to Vdd. With node 209 thus being pulled up to Vdd, the voltage Vdd is applied across capacitor 205, and the capacitor 205 is recharged back to Vdd from $Vdd-\Delta V$.

Thereupon, during a third phase, the first clock signal Lclk is LOW again and consequently, p-mos FET 201 turns ON, n-mos FET 203 turns OFF, and node 207 is pulled up towards Vdd. Since capacitor 205 has been recharged to Vdd in the previous clock phase, the first voltage output V11 at node 209 rises again back up to Vdd*2. At the same time, the second clock signal $\overline{\text{Lclk}}$ is HIGH and consequently, p-mos FET 202 turns OFF, n-mos FET 204 turns ON, and node 208 is pulled down towards ground. Although capacitor 206 had been charged to Vdd in a previous cycle, capacitor 206 has lost some voltage $\Delta V$ due to charge sharing, capacitive coupling, and/or leakage while providing the second voltage output V12 to the 2nd stage voltage doubler circuit during the second phase of the first clock signal. Consequently, the second voltage output V12 at node 210 falls from $Vdd*2-\Delta V$ back down to $Vdd-\Delta V$ during the third phase. Since the first voltage output V12 at node 210 is connected to the gate of n-mos FET 211 and almost simultaneously drops to Vdd, n-mos FET 211 is turned OFF, and the first voltage output V11 does not discharge back through the n-mos FET 211 and is therefore, available as an input and provides current to the 2nd stage voltage doubler circuit 300. Also, since the first voltage output V11 at node 209 is connected to a gate of n-mos FET 212 and is greater than the voltage at node 210 connected to the source of the n-mos FET 212, the n-mos FET 212 turns ON, thus pulling node 210 up to Vdd. With node 210 thus being pulled up to Vdd, the voltage Vdd is applied across capacitor 206, and the capacitor 206 is recharged back to Vdd from $Vdd-\Delta V$.

During fourth and subsequent phases, the cycle as described above repeats with the first voltage output V11 rising to substantially Vdd*2 during the first (odd numbered) phases of the first clock signal Lclk, and falling back substantially to Vdd during the second (even numbered) phases of the first clock signal Lclk, and the second voltage output V12 falling back substantially to Vdd during the first (odd numbered) phases of the second clock signal $\overline{\text{Lclk}}$, and rising substantially to Vdd*2 during the second (even numbered) phases of the second clock signal $\overline{\text{Lclk}}$. At the same time, while the first voltage output V11 is substantially rising to Vdd*2, the capacitor 206 is recharging, and while the second voltage output V12 is substantially rising to Vdd*2, the capacitor 205 is recharging. For descriptive convenience, the lost voltage $\Delta V$ due to charge sharing, capacitive coupling, and/or leakage is generally not included in this description of the preferred embodiment of the invention, but is to be understood to be considered by use of the term "substantially" herein.

Figure 6:
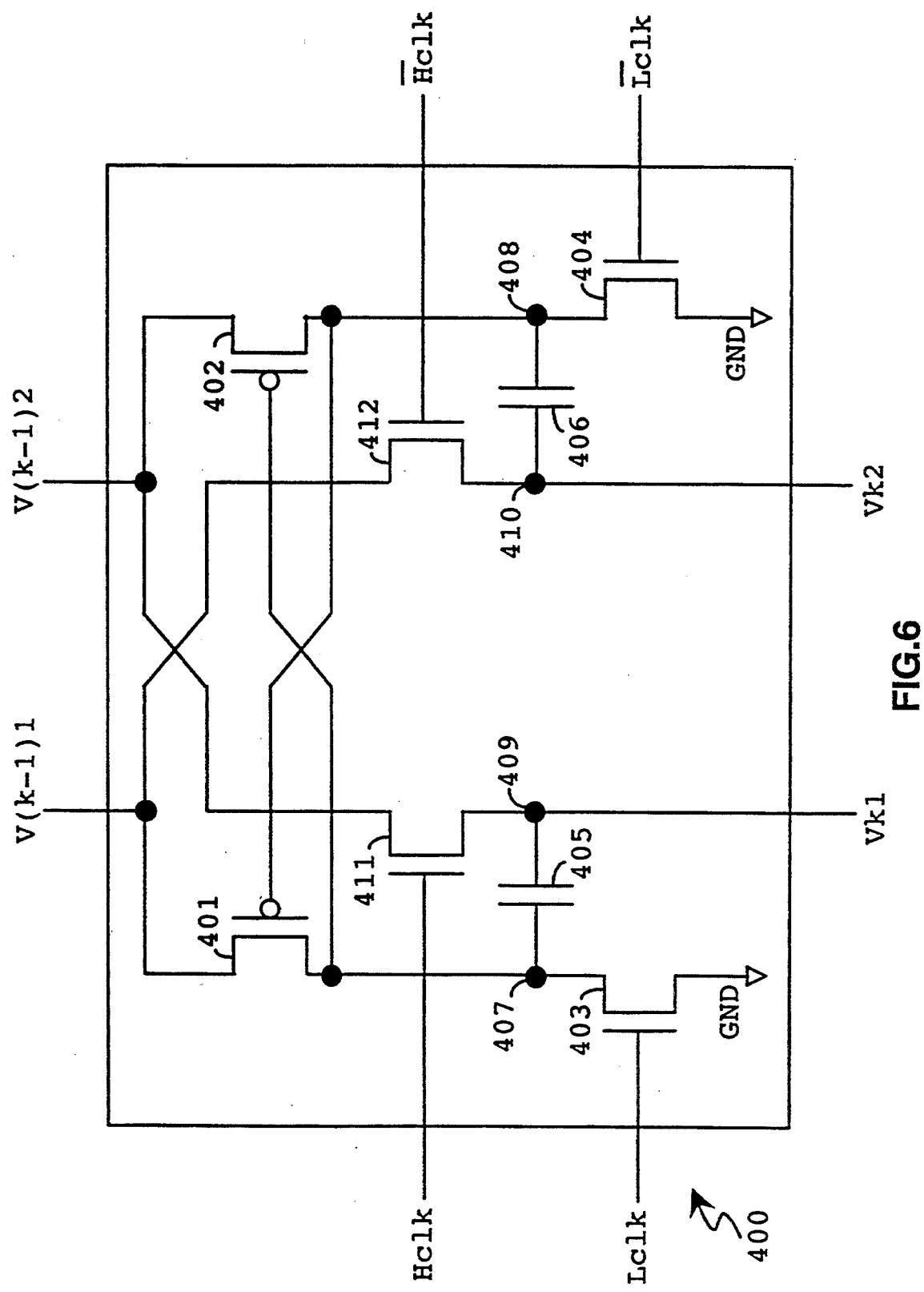
FIG. 6 illustrates, as an example, a circuit diagram of the kth Stage Voltage Doubler Circuit block of FIG. 3, utilizing aspects of the present invention.

FIG. 6 illustrates, as an example, a circuit diagram of the kth stage voltage doubler circuit 400, where it is to be understood that the kth stage voltage doubler circuit 400 shown in the figure is representative of each of the voltage doubler circuits from and including, the 2nd to the nth stage. During the first phase of the first clock signal Lclk, the first clock signal Lclk is LOW, and since the second clock signal $\overline{\text{Lclk}}$ is generally an inverted version of the first clock signal Lclk, the second clock signal, $\overline{\text{Lclk}}$, is HIGH. Also, since the first and second high voltage clock signals, Hclk and $\overline{\text{Hclk}}$, respectively, are synchronized with the first and second clock signals, Lclk and $\overline{\text{Lclk}}$, respectively, when the first phases of the first and second clock signals, Lclk and $\overline{\text{Lclk}}$, respectively, are LOW and HIGH, respectively, then the first phases of the first and second high voltage clock signals, Hclk and $\overline{\text{Hclk}}$, respectively, are also LOW and HIGH, respectively.

Further, when the first phases of the first clock and high voltage clock signals, Lclk and Hclk, respectively, are both LOW, then both n-mos FETs 403 and 411 are OFF, and when the first phases of the second clock and high voltage clock signals, $\overline{\text{Lclk}}$ and $\overline{\text{Hclk}}$, respectively, are both HIGH, then both n-mos FETs 404 and 412 are ON. With n-mos FET 404 turned ON, the voltage at node 408 is pulled LOW (down towards ground) and accordingly, p-mos FET 401 is turned ON. Conversely, with n-mos FET 403 turned OFF, the voltage at node 407 is allowed to go HIGH and accordingly, p-mos FET 402 is turned OFF.

Thus, during the first phase of the clock signals, Lclk, $\overline{\text{Lclk}}$, Hclk, and $\overline{\text{Hclk}}$, with p-mos FET 401 turned ON and n-mos FETs 403 and 411 turned OFF, the first kth voltage output Vk1 at node 409 is substantially equal to Vdd*$2^k$. Likewise, during the first phase of the clock signals, Lclk, $\overline{\text{Lclk}}$, Hclk, and $\overline{\text{Hclk}}$, with p-mos FET 402 turned OFF and n-mos FETs 404 and 412 turned ON, the second kth voltage output Vk2 at node 410 is substantially equal to Vdd*$2^{(k-1)}$.

As previously stated, in the preferred embodiment of the present invention, the first and second high voltage clock signals, Hclk and $\overline{\text{Hclk}}$, respectively, cycle between a LOW of 0 volts and a HIGH of Vpp volts. In practice, however, in order to properly turn ON n-mos FETs 411 and 412, the HIGH voltage for the two high voltage clock signals, Hclk and $\overline{\text{Hclk}}$, need only be greater than Vdd*$2^{k-1}$ plus a threshold turn-on voltage associated with the n-mos FETs 411 and 412, so the difference between their gate voltages Vg and their source voltages Vs are greater than the threshold turn-on voltage. Conversely, in order to properly turn OFF n-mos FETs 411 and 412, the HIGH voltage for the two high voltage clock signals, Hclk and $\overline{\text{Hclk}}$, need only to be less than Vdd*$2^{(k-2)}$ minus the threshold turn-on voltage, so the difference between their gate voltages Vg and their source voltages Vs are less than the threshold turn-on voltage.

Proceeding with the second phase of the first clock signal Lclk, the first clock signal Lclk is now HIGH and since the second clock signal $\overline{\text{Lclk}}$ is generally an inverted version of the first clock signal Lclk, the second clock signal $\overline{\text{Lclk}}$ is LOW. Also, since the first and second high voltage clock signals, Hclk and $\overline{\text{Hclk}}$, respectively, are synchronized with the first and second clock signals, Lclk and $\overline{\text{Lclk}}$, respectively, when the second phases of the first and second clock signals, Lclk and $\overline{\text{Lclk}}$, respectively, are HIGH and LOW, respectively, then the second phases of the first and second high voltage clock signals, Hclk and $\overline{\text{Hclk}}$, respectively, are also HIGH and LOW, respectively.

Further, when the second phases of the first clock and high voltage clock signals, Lclk and Hclk, respectively, are both HIGH, then both n-mos FETs 403 and 413 are ON, and when the first phases of the second clock and high voltage clock signals, $\overline{\text{Lclk}}$ and $\overline{\text{Hclk}}$, respectively, are both LOW, then both n-mos FETs 404 and 412 are OFF. With n-mos FET 404 turned OFF, the voltage at node 408 is allowed to go HIGH and accordingly, p-mos FET 401 turns OFF. Conversely, with n-mos FET 403 turned ON, the voltage at node 407 is pulled down LOW (to ground) and accordingly, p-mos FET 402 turns ON.

Thus, during the second phase of the clock signals, Lclk, $\overline{\text{Lclk}}$, Hclk, and $\overline{\text{Hclk}}$, with p-mos FET 401 turned OFF and n-mos FETs 403 and 411 turned ON, the first kth voltage output Vk1 at node 409 is being recharged through capacitor 405 to Vdd*$2^{(k-1)}$. Likewise, during the second phase of the clock signals, Lclk, $\overline{\text{Lclk}}$, Hclk, and $\overline{\text{Hclk}}$, with p-mos FET 402 turned ON and n-mos FETs 404 and 412 turned OFF, the second kth voltage output Vk2 at node 410 is substantially equal to Vdd*$2^k$.

Thereafter, during third and subsequent phases of the clock signals, Lclk, $\overline{\text{Lclk}}$, Hclk, and $\overline{\text{Hclk}}$, the first and second kth voltage outputs, Vk1 and Vk2, respectively, flip-flop back and forth between the voltages Vdd*$2^k$ and Vdd*$2^{(k-1)}$, wherein on odd numbered phases, the first kth voltage output Vk1 is substantially equal to Vdd*$2^{(K-1)}$, the second kth voltage output Vk2 is substantially equal to Vdd*$2^k$, and capacitor 406 is recharging, and on even numbered phases, the first kth voltage output Vk1 is substantially equal to Vdd*$2^{(k-1)}$, the second kth voltage output Vk2 is substantially equal to Vdd*$2^k$, and capacitor 405 is recharging.

Figure 7:
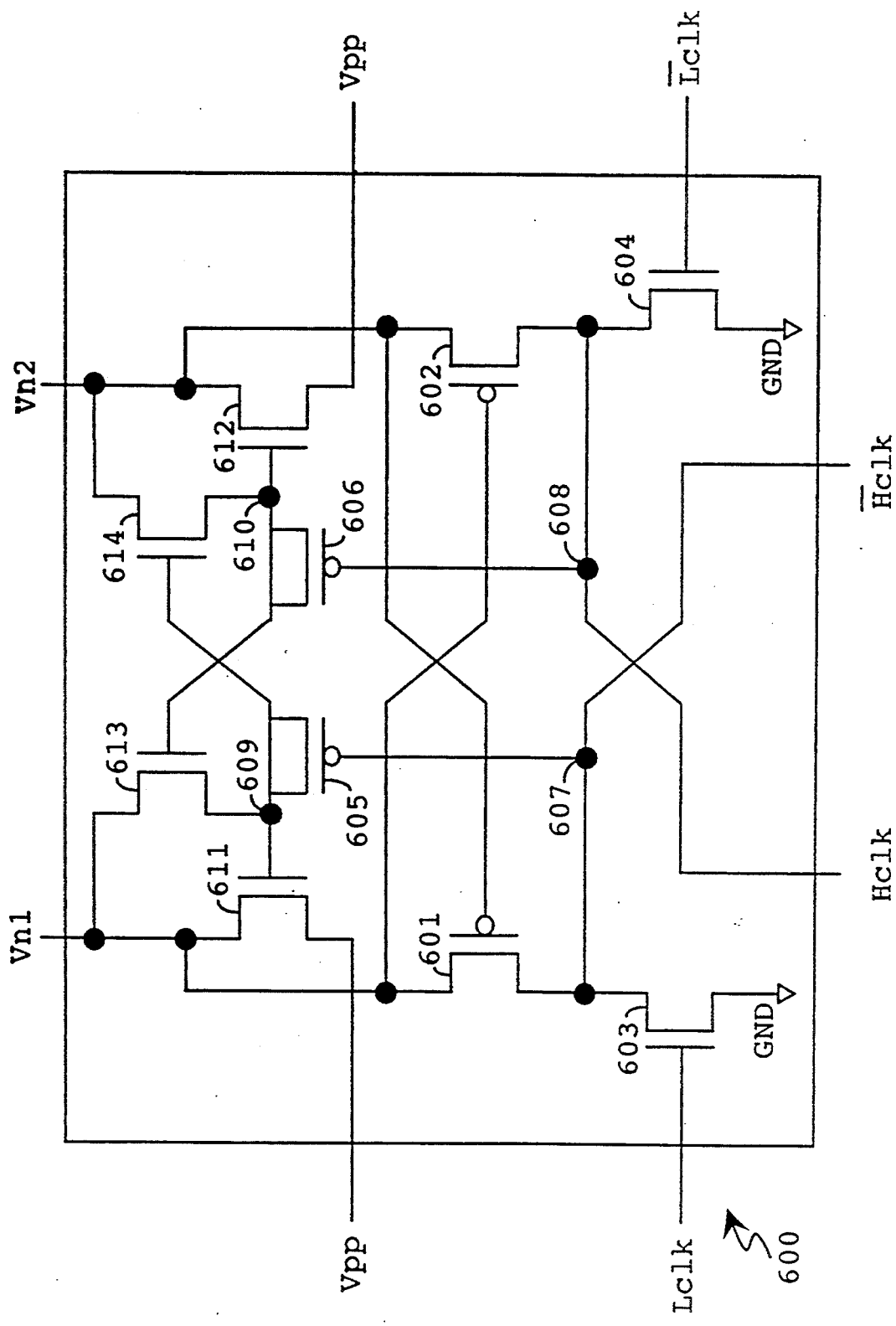
FIG. 7 illustrates, as an example, a circuit diagram of the Output Stage Circuit block of FIG. 3, utilizing aspects of the present invention.

FIG. 7 illustrates, as an example, a circuit diagram of the Output Stage Circuit block of FIG. 3. During the first phase of the first clock signal Lclk, the first clock signal Lclk is LOW, and since the second clock signal $\overline{\text{Lclk}}$ is generally an inverted version of the first clock signal Lclk, the second clock signal $\overline{\text{Lclk}}$ is HIGH. Accordingly, with the first clock signal Lclk LOW, n-mos FET 603 is turned OFF allowing node 607 to go HIGH, and with the second clock signal $\overline{\text{Lclk}}$ HIGH, n-mos FET 604 is turned ON pulling node 608 LOW (to ground).

Also, as previously explained with reference to the kth stage voltage doubler circuit 400, the first nth voltage output Vn1 will be at a voltage substantially equal to Vdd*$2^2$ (referred to hereinafter as Vpp since this is the maximum output of the charge pump circuit 100), and the second nth voltage output Vn2 will be at a voltage substantially equal to Vdd*$2^{(n-1)}$ (referred to hereinafter by its equivalent, Vpp/2 or Vpp*0.5) during the first phase of the first clock signal Lclk.

Consequently, since p-mos FET 601 has its gate connected to Vn2 and source connected to Vn1, and p-mos FET 602 has its gate connected to Vn1 and source connected to Vn2, p-mos FET 601 is turned ON since its gate voltage (Vn2=Vpp/2) is sufficiently less than its source voltage (Vn1=Vpp), and p-mos FET 602 is turned OFF since its gate voltage (Vn1=Vpp) is sufficiently greater than its source voltage (Vn2=Vpp/2). With p-mos FET 601 thus turned ON during the first phase of the first clock signal Lclk, node 607 and consequently, the second high voltage clock signal $\overline{\text{Hclk}}$ is pulled up to Vpp, and with p-mos FET 602 thus turned OFF during the first phase of the first clock signal Lclk, node 608 and consequently, the first high voltage clock signal Hclk is pulled down to ground (LOW).

Assuming that transistor capacitors 605 and 606 have been charged to Vpp/2 (Vpp*0.5) on a previous clock cycle, when node 607 is pulled up to Vpp during the first phase of the first clock signal Lclk, node 609 becomes Vpp*1.5. Node 610 stays at Vpp*0.5, however, because when node 609 goes to Vpp*1.5, it turns on n-mos FET 614, which then connects node 610 to Vn2, which is at Vpp*0.5. Since n-mos FET 613 has its gate connected to node 610 and source connected to node 609, and n-mos FET 614 has its gate connected to node 609 and source connected to node 610, n-mos FET 613 is turned OFF during the first phase of the first clock signal Lclk since its gate voltage (Vpp/2) is sufficiently less than its source voltage (Vpp*1.5), and n-mos FET 614 is turned ON during the first phase of the first clock signal Lclk since its gate voltage (Vpp*1.5) is sufficiently greater than its source voltage (Vpp/2), wherein the term "sufficiently" as used herein, is understood to take into account the threshold voltages of the FETs.

At the same time, since n-mos FET 611 has its gate connected to node 609 and source connected to Vpp, and n-mos FET 612 has its gate connected to node 610 and source also connected to Vpp, n-mos FET 611 is turned ON during the first phase of the first clock signal Lclk since its gate voltage (Vpp*1.5) is sufficiently greater than its source voltage (Vpp), and n-mos FET 612 is turned OFF during the first phase of the first clock signal Lclk since its gate voltage (Vpp*0.5) is sufficiently less than its source voltage (Vpp). Thus, during the first phase of the first clock signal Lclk, with n-mos FETs 611 and 614 turned ON, and n-mos FETs 612 and 613 turned OFF, the output voltage Vpp of the charge pump 100 is provided at the source of the n-mos FET 611 while the transistor capacitor 606 is being recharged to Vpp/2.

During a second phase of the first clock signal Lclk, the first clock signal Lclk is HIGH, and since the second clock signal $\overline{Lclk}$ is generally an inverted version of the first clock signal Lclk, the second clock signal $\overline{Lclk}$ is LOW. Accordingly, with the first clock signal $\overline{Lclk}$ HIGH, n-mos FET 603 is turned ON pulling node 607 to ground (LOW), and with the second clock signal $\overline{Lclk}$ LOW, n-mos FET 604 is turned OFF allowing node 608 to go to Vpp through p-mos FET 602. Also, as previously explained with reference to the kth stage voltage doubler circuit 400, the first nth voltage output Vn1 will be substantially equal to Vdd*$2^{(n-1)}$, and the second nth voltage output Vn2 will be substantially equal to Vdd$2^n$.

Consequently, p-mos FET 601 is turned OFF since its gate voltage (Vn2=Vpp) is sufficiently greater than its source voltage (Vn1=Vpp/2) and p-mos FET 602 is turned ON since its gate voltage (Vn1=Vpp/2) is sufficiently less than its source voltage (Vn2=Vpp). With p-mos FET 601 thus turned OFF during the second phase of the first clock signal Lclk, node 607 and consequently, the second high voltage clock signal $\overline{Hclk}$ is pulled down to ground (0 volts), and with p-mos FET 602 thus turned ON during the second phase of the first clock signal Lclk, node 608 and consequently, the first high voltage clock signal Hclk is pulled up to Vpp.

Assuming transistor capacitors 605 and 606 have been charged to Vpp/2 (Vpp*0.5) in a previous clock cycle, when node 607 is pulled down to ground (0 volts) during the second phase of the first clock signal Lclk, node 609 drops back to Vpp*0.5, and when node 608 is pulled up to Vpp during the second phase of the first clock signal Lclk, node 610 rises to Vpp*1.5. Also, n-mos FET 613 is turned ON during the second phase of the first clock signal Lclk since its gate voltage (Vpp*1.5) is sufficiently greater than its source voltage (Vpp/2), and n-mos FET 614 is turned OFF during the second phase of the first clock signal Lclk since its gate voltage (Vpp*0.5) is sufficiently less than its source voltage (Vpp*1.5). Further, n-mos FET 611 is turned OFF during the second phase of the first clock signal Lclk since its gate voltage (Vpp*0.5) is sufficiently less than its source voltage (Vpp), and n-mos FET 612 is turned ON during the second phase of the first clock signal Lclk since its gate voltage (Vpp*1.5) is sufficiently greater than its source voltage (Vpp). Thus, during the second phase of the first clock signal Lclk, with n-mos FETs 611 and 614 turned OFF, and n-mos FETs 612 and 613 turned ON, the output voltage Vpp of the charge pump 100 is provided at the source of the n-mos FET 612 while the transistor capacitor 605 is being recharged to Vpp/2.

During third and subsequent phases, the cycle as described above repeats with the output voltage Vpp and current Ipp being provided at the source of the n-mos FET 611 while the transistor capacitor 606 is being recharged to Vpp*0.5 on odd phases of the first clock signal Lclk, and with the output voltage Vpp and current Ipp being provided at the source of the n-mos FET 612 while the transistor capacitor 605 is being recharged to Vpp0.5 on even phases of the first clock signal Lclk. Also, during third and subsequent phases of the first clock signal Lclk, the first high voltage clock signal Hclk is at Vpp and 0 volts during odd and even phases, respectively, of the first clock signal Lclk, and the second high voltage clock signal $\overline{Hclk}$ is at 0 volts and Vpp during odd and even phases, respectively, of the first clock signal Lclk.

Figure 8A:
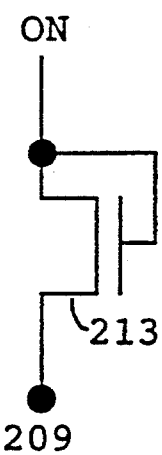
FIGS. 8A–8D illustrate, as examples, circuit diagrams of node initialization circuits for the charge pump circuit illustrated in FIGS. 3–7, utilizing aspects of the present invention.
Figure 8B:
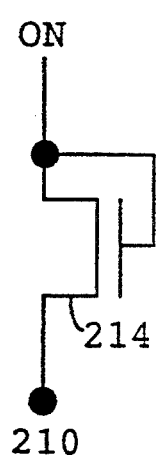
Figure 8C:
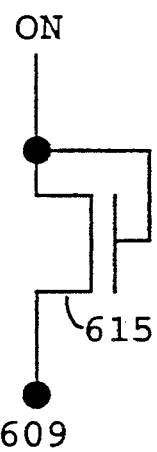
Figure 8D:
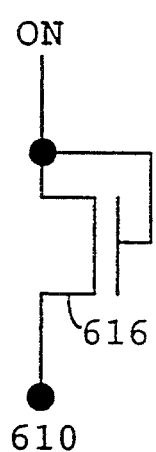

FIGS. 8A-8D illustrate, as examples, circuit diagrams of node initializing circuits for getting the charge pump circuit 100 started. For example, FIGS. 8A and 8B illustrate circuits useful for precharging the capacitors 205 and 206, respectively, of the 1st stage voltage doubler circuit 200 at power on. By applying an ON voltage through diode transistors 213 and 214, to the nodes 209 and 210, respectively, a precharge of VON (preferably Vdd, but at least greater than VT) is placed across each of the capacitors 205 and 206 to get the 1st stage voltage doubler circuit 200 of the charge pump circuit. 100 started. Thereafter, during the recharge phases of the first and second clock signals, Lclk and $\overline{Lclk}$, respectively, the capacitors 205 and 206 are further charged up to Vdd as explained above. Similarly, FIGS. 8C and 8D illustrate circuits useful for precharging the transistor capacitors 605 and 606, respectively, of the output stage circuit 600 at power on. By applying an ON voltage through diode transistors 615 and 616, to the nodes 609 and 610, respectively, a precharge of VON is placed across each of the transistor capacitors 605 and 606 to get the output stage circuit 600 of the charge pump circuit 100 started. Thereafter, during the recharge phases of the first and second clock signals, Lclk and $\overline{Lclk}$, respectively, the transistor capacitors 605 and 606 are further charged up to Vpp/2 as explained above. Similar circuits could be used to precharge each of the capacitors for each of the other voltage doubler stage circuits in the charge pump circuit 100. In practice, however, the four precharge circuits of FIGS. 8A-8D have been found to provide adequate results.

What is claimed is:

1. A charge pump circuit comprising a plurality of voltage doubler circuits, wherein a 1st one of said voltage doubler circuits receives a voltage Vdd and generates, in response to a first clock signal, a first output voltage substantially equal to 2*Vdd during odd phases of said first clock signal and Vdd during even phases of said first clock signal, and a kth one of said voltage doubler circuits receives a first (k−1)th output voltage of a (k−1)th one of said voltage doubler circuits and generates, in response to said first clock signal, a first kth output voltage substantially equal to $2^k$*Vdd during said odd phases of said first clock signal and $2^{(k-1)}$*Vdd during said even phases of said first clock signal.

2. The charge pump circuit comprising a plurality of voltage doubler circuits, wherein a 1st one of said voltage doubler circuits receives a voltage Vdd and generates, in response to a first clock signal, a first output voltage substantially equal to 2*Vdd on a first phase of said first clock signal, and a kth one of said voltage doubler circuits receives a first (k−1)th output voltage of a (k−1)th one of said voltage doubler circuits and generates, in response to said first clock signal, a first kth output voltage substantially equal to $2^k$*Vdd on said first phase of said first clock signal; wherein said first output voltage is substantially equal to Vdd on a second phase of said first clock signal, and said first kth output voltage is substantially equal to $2^{(k-1)}$*Vdd on said second phase of said first clock signal; and wherein said 1st one of said voltage doubler circuits also generates, in response to a second clock signal, a second output voltage substantially equal to Vdd on a first phase and a 2*Vdd on a second phase of said second clock signal, and said kth one of said voltage doubler circuits further receives a second (k−1)th output voltage of said (k−1)th one of said voltage doubler circuits and generates, in response to said second clock signal, a second kth output voltage substantially equal to $2^{(k-1)}$*Vdd on said first phase and $2^k$*Vdd on said second phase of said second clock signal, wherein said second clock signal is such that when said first phase of said first clock signal is low, said first phase of said second clock signal is high, and when said first phase of said second clock signal is low, said first phase of said first clock signal is high.

3. The charge pump circuit as recited in claim 2, wherein said 1st one of said voltage doubler circuits comprises:
a first capacitor;
a first p-mos FET having a source connected to said voltage Vdd, a drain connected to a first end of said first capacitor, and a gate connected to said first clock signal;
a first n-mos FET having a drain connected to said first end of said first capacitor, a source connected to ground, and a gate connected to said first clock signal; and
a second n-mos FET having a drain connected to said voltage Vdd, a source connected to a second end of said first capacitor, and a gate responsive to said first clock signal such said second end of said first capacitor provides said first output voltage which is substantially equal to 2*Vdd on said first phase and Vdd on said second phase of said first clock signal.

4. The charge pump circuit as recited in claim 2, wherein said 1st one of said voltage doubler circuits comprises:
first and second capacitors;
first and second p-mos FETs, said first p-mos FET having a source connected to said voltage Vdd, a drain connected to a first end of said first capacitor, and a gate connected to said first clock signal, and said second p-mos FET having a source connected to said voltage Vdd, a drain connected to a first end of said second capacitor, and a gate connected to said second clock signal;
first and second n-mos FETs, said first n-mos FET having a drain connected to said first end of said first capacitor, a source connected to ground, and a gate connected to said first clock signal, and said second n-mos FET having a drain connected to said first end of said second capacitor, a source connected to ground, and a gate connected to said second clock signal; and
third and fourth n-mos FETs, said third n-mos FET having a drain connected to said voltage Vdd, a source connected to a second end of said first capacitor, and a gate, and said fourth n-mos FET having a drain connected to said voltage Vdd, a source connected to a second end of said second capacitor and cross-coupled to said gate of said third n-mos FET, and a gate cross-coupled to said source of said third n-mos FET, wherein said second end of said first capacitor provides said first output voltage which is substantially equal to 2*Vdd on said first phase and Vdd on said second phase of said first clock signal, and said second end of second capacitor provides said second output voltage which is substantially equal to Vdd on said first phase and 2*Vdd on said second phase of said second clock signal.

5. The charge pump circuit as recited in claim 4, further comprising:
first means, connected to said second end of said first capacitor, for initially charging up said first capacitor at power-on; and
second means, connected to said second end of said second capacitor, for initially charging up said second capacitor at power-on.

6. The charge pump circuit as recited in claim 2, further comprising an output circuit, wherein said output circuit comprises:
first and second output capacitors;
first and second output p-mos FETs, said first output p-mos FET having a source connected to a first output voltage of a last one of said plurality of voltage doubler circuits, a drain, and a gate, and said second output p-mos FET having a source connected to a second output voltage of said last one of said plurality of voltage doubler circuits and cross coupled to said gate of said first output p-mos FET, a gate cross-coupled to said source of said first output p-mos FET, and a drain; and
first and second output n-mos FETs, said first output n-mos FET having a drain connected to said drain of said first output p-mos FET and providing a second high voltage clock signal, a gate connected to said first clock signal, and a source connected to ground, and said second output n-mos FET having a drain connected to said drain of said second output p-mos FET and providing a first high voltage clock signal, a gate connected to said second clock signal, and a source connected to ground.

7. The charge pump circuit as recited in claim 6, wherein said kth one of said voltage doubler circuits comprises:

first and second kth capacitors;

first and second kth p-mos FETs, said first kth p-mos FET having a source connected to said first (k−1)th output voltage, a drain connected to a first end of said first kth capacitor, and a gate, and said second kth p-mos FET having a source connected to said second (k−1)th output voltage, a drain connected to a first end of said second kth capacitor and cross-coupled to said gate of said first kth p-mos FET, and a gate cross-coupled to said drain of said first kth p-mos FET;

first and second kth n-mos FETs, said first kth n-mos FET having a drain connected to said first end of said first kth capacitor, a source connected to ground, and a gate connected to said first clock signal, and said second kth n-mos FET having a drain connected to said first end of said second kth capacitor, a source connected to ground, and a gate connected to said second clock signal; and third and fourth kth n-mos FETs, said third kth n-mos FET having a drain connected to said second (k−1)th output voltage, a source connected to a second end of said first kth capacitor, and a gate connected to said first high voltage clock signal of said output circuit, and said fourth kth n-mos FET having a drain connected to said first (k−1)th output voltage, a source connected to a second end of said second kth capacitor, and a gate connected to said second high voltage clock signal of said output circuit, wherein said source of said third n-mos FET provides said first kth output voltage and said source of said fourth n-mos FET provides said second kth output voltage.

8. The charge pump circuit as recited in claim 7, wherein said last one of said plurality of voltage doubler circuits being a nth one of said plurality of voltage doubler circuits, and said output circuit further comprises:

first and second output capacitors, said first output capacitor having a first end connected to said drain of said first output n-mos FET, and said second output capacitor having a first end connected to said drain of said second output n-mos FET;

third and fourth output n-mos FETs, said third output n-mos FET having a drain connected to said first output voltage of said last one of said plurality of voltage doubler circuits, a source connected to a second end of said first output capacitor, and a gate, and said fourth output n-mos FET having a drain connected to said second output voltage of said last one of said plurality of voltage doubler circuits, a source connected to a second end of said second output capacitor and cross-coupled to said gate of said third output n-mos FET, and a gate cross-coupled to said source of said third output n-mos FET; and fifth and sixth output n-mos FETs, said fifth output n-mos FET having a drain connected to said drain of said third output n-mos FET, a gate connected to said source of said third output n-mos FET, and a source providing a voltage output Vpp of said charge pump circuit during said first phase of said first clock signal, and said sixth output n-mos FET having a drain connected to said drain of said fourth output n-mos FET, a gate connected to said source of said fourth output n-mos FET, and a source providing said voltage output Vpp of said charge pump circuit during said second phase of said first clock signal, wherein said voltage output Vpp is substantially equal to $2^n * Vdd$, and a current output Ipp of said charge pump circuit is provided by said source of said fifth output n-mos FET during said first phase of said first clock signal and by said source of said sixth output n-mos FET during said second phase of said first clock signal.

9. The charge pump circuit as recited in claim 8, wherein said first output capacitor comprises a third output p-mos FET having a source and a drain connected together and to said source of said third output n-mos FET, and a gate connected to said drain of said first output n-mos FET, and said second output capacitor comprises a fourth output p-mos FET having a source and a drain connected together and to said source of said fourth output n-mos FET, and a gate connected to said drain of said second output n-mos FET.

10. The charge pump circuit as recited in claim 8, further comprising:

third means, connected to said first end of said first output capacitor, for initially charging up said first output capacitor at power-on; and fourth means, connected to said first end of said second output capacitor, for initially charging up said second output capacitor at power-on.

11. A method of generating a high voltage Vpp from a lower voltage Vdd comprising the steps of:

connecting, during a first phase of a first clock signal, a first end of a first capacitor having a charge of Vdd to said lower voltage Vdd, and during a second phase of said first clock signal, said first end of said first capacitor to ground, so that a second end of said first capacitor provides a first output voltage substantially equal to 2*Vdd during said first phase of said first clock signal and substantially equal to Vdd during said second phase of said first clock signal; and connecting, during said first phase of said first clock signal, a first end of a second capacitor having a charge of 2*Vdd to said first output voltage, and during said second phase of said first clock signal, said first end of said second capacitor to ground, so that a second end of said second capacitor provides a second output voltage substantially equal to 4*Vdd during said first phase of said first clock signal and substantially equal to 2*Vdd during said second phase of said first clock signal.

12. The method as recited in claim 11, further comprising the steps of:

connecting, during said first phase of said first clock signal, a first end of a third capacitor having a charge of Vdd to ground, and during said second phase of said first clock signal, said first end of said third capacitor to said lower voltage Vdd, so that a second end of said third capacitor provides a third output voltage substantially equal to Vdd during said first phase of said first clock signal and substantially equal to 2*Vdd during said second phase of said first clock signal; and connecting, during said first phase of said first clock signal, a first end of a fourth capacitor having a charge of 2*Vdd to ground, and during said second phase of said first clock signal, said first end of said fourth capacitor to said third output voltage, so that a second end of said fourth capacitor provides a fourth output voltage substantially equal to 2*Vdd during said first phase of said first clock signal and substantially equal to 4*Vdd during said second phase of said first clock signal.

13. The method as recited in claim 12, further comprising the steps of:
connecting, during said first phase of said first clock signal, said second end of said fourth capacitor to said first output voltage and said first end of said fourth capacitor to ground so that said fourth capacitor is recharged to 2*Vdd; and
connecting, during said second phase of said first clock signal, said second end of said second capacitor to said third output voltage and said first end of said second capacitor to ground so that said second capacitor is recharged to 2*Vdd.

14. A method of generating a high voltage from a lower voltage comprising the steps of:
connecting, in response to a second phase of a high voltage clock signal, a first end of a capacitor in at least one stage of a charge pump circuit to a voltage output of a previous stage of said charge pump circuit, and disconnecting, in response to a first phase of said high voltage clock signal, said first end of said capacitor so that said first end of said capacitor, having a charge equal to said voltage output of said previous stage, provides a voltage output for that at least one stage which is substantially equal to twice said voltage output of said previous stage during said first phase of said high voltage clock signal, and is substantially equal to said voltage output of said previous stage during said second phase of said high voltage clock signal; and
generating said high voltage clock signal from a voltage output of a last stage of said charge pump circuit, and providing said generated high voltage clock signal to said at least one stage of said charge pump circuit.

15. The method as recited in claim 14, wherein said connecting step comprises the step of providing a high voltage clock signal to a gate of a field-effect-transistor, which in response to a second phase of said high voltage clock signal electrically connects a first end of a capacitor in at least one stage of a charge pump circuit to a voltage output of a previous stage of the charge pump circuit, and in response to a first phase of the high voltage clock signal, electrically disconnects said first end of said capacitor from said voltage output of said previous stage, so that said first end of said capacitor, having a charge equal to said voltage output of said previous stage, provides a voltage output for that at least one stage which is substantially equal to twice said voltage output of said previous stage during said first phase of said high voltage clock signal, and is substantially equal to said voltage output of said previous stage during said second phase of said high voltage clock signal.

* * * * *

UNITED STATES PATENT AND TRADEMARK OFFICE
CERTIFICATE OF CORRECTION

PATENT NO.   : 5,436,587
DATED        : July 25, 1995
INVENTOR(S)  : Raul-Adrian Cernea It is certified that error appears in the above-indentified patent and that said Letters Patent is hereby corrected as shown below:

In Column 13, Line 20 in Claim 2 replace:
"2. The charge pump circuit comprising a plurality of" with --2. A charge pump circuit comprising a plurality of--

Signed and Sealed this

Tenth Day of September, 1996

Attest:

BRUCE LEHMAN

Attesting Officer        Commissioner of Patents and Trademarks